United States Patent
Suzuki et al.

(10) Patent No.: US 9,034,718 B2
(45) Date of Patent: May 19, 2015

(54) FILM FORMING METHOD FOR FORMING BORON-ADDED SILICON NITRIDE FILM

(75) Inventors: Keisuke Suzuki, Nirasaki (JP); Kentaro Kadonaga, Nirasaki (JP); Yuichiro Morozumi, Nirasaki (JP)

(73) Assignee: Tokyo Electron Limited (JP)

( * ) Notice: Subject to any disclaimer, the term of this patent is extended or adjusted under 35 U.S.C. 154(b) by 242 days.

(21) Appl. No.: 13/571,559

(22) Filed: Aug. 10, 2012

(65) Prior Publication Data

US 2013/0037873 A1    Feb. 14, 2013

(30) Foreign Application Priority Data

Aug. 11, 2011    (JP) .................................. 2011-176138

(51) Int. Cl.
| | | |
|---|---|---|
| H01L 21/02 | (2006.01) | |
| H01L 49/02 | (2006.01) | |
| H01L 27/108 | (2006.01) | |
| C23C 16/34 | (2006.01) | |
| C23C 16/455 | (2006.01) | |

(52) U.S. Cl.
CPC .......... H01L 28/91 (2013.01); H01L 27/10852 (2013.01); C23C 16/345 (2013.01); C23C 16/45531 (2013.01); C23C 16/45542 (2013.01); C23C 16/45578 (2013.01); H01L 21/0217 (2013.01); H01L 21/02274 (2013.01); H01L 21/0228 (2013.01)

(58) Field of Classification Search
CPC .............. H01L 28/91; H01L 27/10852; H01L 21/0228; H01L 21/0217; H01L 21/02274; C23C 16/345; C23C 16/45531; C23C 16/45542; C23C 16/45578
See application file for complete search history.

(56) References Cited

U.S. PATENT DOCUMENTS

| | | | |
|---|---|---|---|
| 6,815,350 B2 | 11/2004 | Kim et al. | |
| 6,962,876 B2 | 11/2005 | Ahn et al. | |
| 7,462,571 B2 | 12/2008 | Hasebe et al. | |
| 2003/0201540 A1* | 10/2003 | Ahn et al. | 257/760 |
| 2012/0321791 A1* | 12/2012 | Suzuki et al. | 427/255.38 |

FOREIGN PATENT DOCUMENTS

| | | |
|---|---|---|
| JP | 62156822 | 7/1987 |
| JP | 63120429 | 5/1988 |
| JP | 2004047956 | 2/2004 |
| JP | 2006270016 | 10/2006 |
| JP | 2006287194 | 10/2006 |
| JP | 2010153418 | 7/2010 |
| JP | 2010251654 | 11/2010 |
| JP | 2011029284 | 2/2011 |
| JP | 2011044488 | 3/2011 |

* cited by examiner

*Primary Examiner* — Selim Ahmed
(74) *Attorney, Agent, or Firm* — Cantor Colburn LLP

(57) ABSTRACT

Provided is a semiconductor device capable of preventing destruction of an electrode having a pillar shape and densely arranged. The semiconductor device having a field-effect transistor and a capacitor having a pillar shape, the semiconductor device includes: a first electrode having a pillar shape and electrically connected to an impurity diffusion region of the field-effect transistor; a dielectric film formed at least on a side of the first electrode; a second electrode formed on the dielectric film; and a support film extending in a direction crossing a length direction of the first electrode having the pillar shape, and formed by a boron-added silicon nitride film connected to the first electrode by penetrating through at least a part of the second electrode.

4 Claims, 25 Drawing Sheets

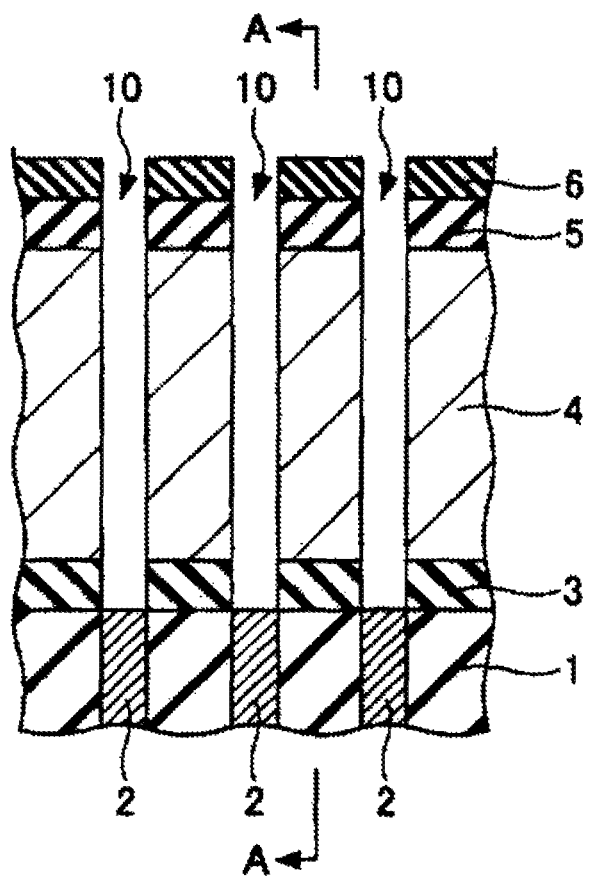

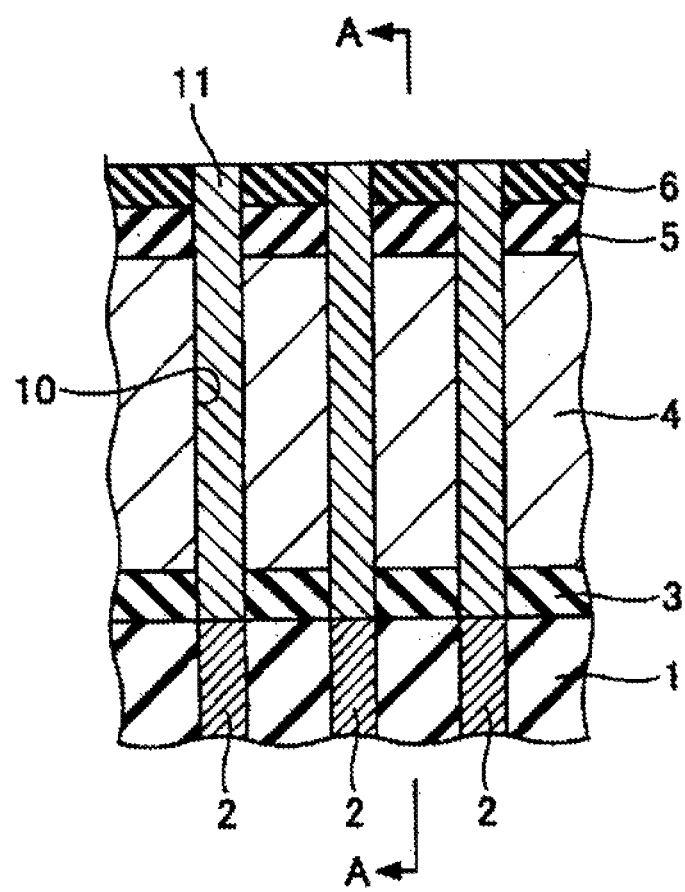

FILM FORMING METHOD FOR FORMING BORON-ADDED SILICON NITRIDE FILM

CROSS-REFERENCE TO RELATED PATENT APPLICATIONS

This application claims the benefit of Japanese Patent Application No. 2011-176138, filed on Aug. 11, 2011, in the Japan Patent Office, the disclosure of which is incorporated herein in its entirety by reference.

BACKGROUND OF THE INVENTION

1. Field of the Invention

The present invention relates to a film forming method of forming a thin film on a substrate, such as a semiconductor wafer, a manufacturing method of a semiconductor device using the same, a film forming apparatus, and a semiconductor device, 2. Description of the Related Art For further high integration of a semiconductor memory device, a memory cell having a pillar shape structure capable of obtaining sufficient electrostatic capacity while reducing an area occupied by a capacitor on a surface of a wafer has attracted attention. In detail, the capacitor in the memory cell includes a lower electrode having a pillar shape, a dielectric film formed on a side of the lower electrode, and an upper electrode formed on the dielectric film. By using the side of the lower electrode having the pillar shape, it is possible to secure an area for the capacitor, thereby obtaining sufficient electrostatic capacity.

Since the lower electrode having the pillar shape described above is formed to have high 2 dimensional (2D) density for high integration, the lower electrode has a high aspect ratio of, for example, a diameter of about 40 nm and a height of about 2000 nm. Accordingly, while manufacturing the memory cell, the lower electrode may be destroyed.

In order to prevent this, there have been attempts to form a support film extending in parallel to a substrate surface and supporting a plurality of lower electrodes by connecting the vicinity of tops of the lower electrodes. For example, Patent Document 1 discloses a silicon nitride film connecting tops of pillar type electrodes formed by ruthenium (Ru).

Meanwhile, according to development trends of semiconductor memory devices, for high integration, it is required to further reduce a size limit. The reducing of the size limit may, for example, deteriorate insulation characteristics of an insulation film, and in order to prevent this, an insulation material that has not been conventionally used is used. One of new materials may have, for example, a film forming temperature lower than that of previous materials. In this case, during processes after forming the insulation film, the insulation film may be deteriorated if a substrate is heated at a temperature higher than a film forming temperature of the insulation film. Accordingly, a temperature of following processes needs to be low, but in this case, for example, a stress applied to the support film described above is increased, thereby destroying a lower electrode having a pillar shape.

(Patent Document 1) Japanese Laid-Open Patent Publication No. 2010-153418
(Patent Document 2) Japanese Laid-Open Patent Publication No. 2006-287194

SUMMARY OF THE INVENTION

The present invention provides a film forming method capable of preventing destruction of an electrode having a pillar shape and densely arranged, a manufacturing method of a semiconductor device using the same, a film forming apparatus, and a semiconductor device.

According to an aspect of the present invention, there is provided a film forming method performed by a film forming apparatus including: a reaction pipe which accommodates a substrate holding unit holding a plurality of substrates; a first gas supply unit which supplies a first source gas containing silicon to the reaction pipe and has a first switch valve for controlling supply and stop of the first source gas to the reaction pipe; a second gas supply unit which supplies a second source gas containing boron to the reaction pipe and has a second switch valve for controlling supply and stop of the second source gas to the reaction pipe; a third gas supply unit which supplies a third source gas containing nitrogen to the reaction pipe, and has a third switch valve for controlling supply and stop of the third source gas to the reaction pipe; and a fourth switch valve which is formed between the reaction pipe and an exhaust unit connected to the reaction pipe, and connects or disconnects between the reaction pipe and the exhaust unit, the film forming method including: forming a boron-added silicon nitride film by repeating a predetermined times of: silicon nitride layer deposition process of forming a silicon nitride layer on the substrate, and a boron nitride layer deposition process of forming the boron nitride layer on the substrate; wherein the silicon nitride layer deposition process comprises supplying the first source gas to the reaction pipe by opening the first switch valve while the fourth switch valve is closed; capturing the first source gas supplied to the reaction pipe in the reaction pipe by closing the first switch valve after a first time period has passed; exhausting an inside of the reaction pipe by opening the fourth switch valve after a second time period has passed, and supplying the third source gas by opening the third switch valve after a third time period has passed, and wherein the boron nitride layer deposition process comprises supplying the second source gas to the reaction pipe by opening the second switch valve while the fourth switch valve is closed; capturing the second source gas supplied to the reaction pipe in the reaction pipe by closing the second switch valve after a first time period has passed; exhausting the inside of the reaction pipe by opening the fourth switch valve after a second time period has passed, and supplying the third source gas by opening the third switch valve after a third time period has passed.

According to another aspect of the present invention, there is provided a film forming apparatus including: a reaction pipe which accommodates a substrate holding unit holding a plurality of substrates; a first source gas supply unit which supplies a first source gas containing silicon to the reaction pipe and has a first switch valve for controlling supply and stop of the first source gas to the reaction pipe; a second source gas supply unit which supplies a second source gas containing boron to the reaction pipe and has a second switch valve for controlling supply and stop of the second source gas to the reaction pipe; a third source gas supply unit which supplies a third source gas containing nitrogen to the reaction pipe, and has a third switch valve for controlling supply and stop of the third source gas to the reaction pipe; a fourth switch valve which is formed between the reaction pipe and an exhaust unit connected to the reaction pipe and connects or disconnects between the reaction pipe and the exhaust unit, and a controller which controls the first, the second, the third and fourth switch valves to form a silicon nitride layer on the substrates by supplying the first source gas to the reaction pipe by opening the first switch valve while the fourth switch valve is closed; capturing the first source gas supplied to the reaction pipe in the reaction pipe by closing the first switch valve after a first time period has passed; exhausting an inside of the reaction pipe by opening the fourth switch valve after a second time period has passed; and supplying the third source gas by opening the third switch valve after a third time period has passed, and to form a boron nitride layer by supplying the second source gas to the reaction pipe by opening the second switch valve while the fourth switch valve is closed; capturing the second source gas supplied to the reaction pipe in the reaction pipe by closing the second switch valve after a first time period has passed; exhausting the inside of the reaction pipe by opening the fourth switch valve after a second time period has passed, and supplying the third source gas by opening the third switch valve after a third time period has passed.

According to another aspect of the present invention, there is provided a manufacturing method of a semiconductor device having a field-effect transistor and a capacitor having a pillar shape, the manufacturing method including: forming a multilayer including a boron-added silicon nitride film on a substrate on which the field-effect transistor is formed; forming a first electrode having a pillar shape and electrically connected to an impurity diffusion region of the field-effect transistor by penetrating through the multilayer; removing the multilayer such that the boron-added silicon nitride film is left; forming a dielectric film at least on a side of the first electrode; and forming a second electrode covering the dielectric film, According to another aspect of the present invention, there is provided a semiconductor device having a field-effect transistor and a capacitor having a pillar shape, the semiconductor device including: a first electrode having a pillar shape and electrically connected to an impurity diffusion region of the field-effect transistor; a dielectric film formed at least on a side of the first electrode; a second electrode formed on the dielectric film; and a support film extending in a direction crossing a length direction of the first electrode having the pillar shape, and formed by a boron-added silicon nitride film connected to the first electrode by penetrating through at least a part of the second electrode.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIGS. 4A and 4B are views for explaining the manufacturing method after FIGS. 3A and 3B, according to an embodiment of the present invention;

FIGS. 5A and 5B are views for explaining the manufacturing method after FIGS. 4A and 4B, according to an embodiment of the present invention;

DETAILED DESCRIPTION OF THE INVENTION

Figure 1:
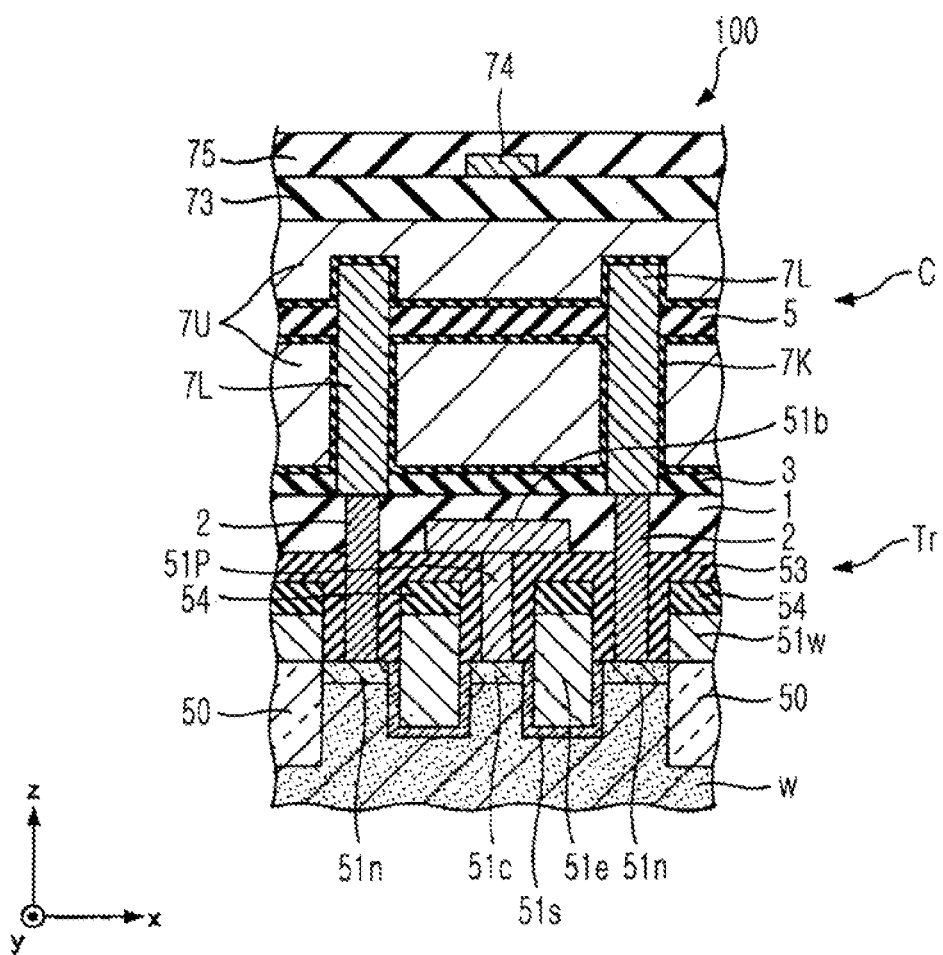
FIG. 1 is a schematic cross-sectional view of a structure of a semiconductor device, according to an embodiment of the present invention.

An embodiment of the present invention achieved on the basis of the findings given above will now be described with reference to the accompanying drawing. In the following description, the constituent elements having substantially the same function and arrangement are denoted by the same reference numerals, and a repetitive description will be made only when necessary.

Hereinafter, the present invention will be described in detail by explaining exemplary embodiments of the invention with reference to the attached drawings. Throughout the drawings, the same or corresponding elements or parts are assigned by the same or corresponding reference numerals, and thus overlapping descriptions thereof are not repeated. Also, the drawings do not show relative ratios between elements and parts, and thus detailed sizes thereof shall be determined by one of ordinary skill in the art based on not limited embodiments below.

(Embodiment 1)

A manufacturing method of a semiconductor device, according to an embodiment 1 of the present invention will now be described with reference to FIGS. 1 through 11, wherein a memory cell including a pillar type capacitor is manufactured.

FIG. 1 is a schematic cross-sectional view of a memory cell 100 constituting a semiconductor device, according to an embodiment of the present invention As shown in FIG. 1, the memory cell 100 includes a (field-effect) transistor Tr formed on a p-type silicon wafer W (hereinafter, referred to as a wafer W), and a capacitor C formed on the transistor Tr via an interlayer insulation film 1. The transistor Tr includes a device isolation region 50 formed by locally embedding an insulator in the wafer W, a gate oxide film $51s$ covering a side wall of a recess portion formed on the wafer W with respect to an active region defined by the device isolation region 50, a gate electrode $51e$ formed to protrude higher than the recess portion while embedding the recess portion defined by the gate oxide film $51s$, and impurity diffusion regions $51c$ and $51n$ as source/drain regions.

Also, the impurity diffusion region $51c$ of the transistor Tr is electrically connected to a bit line $51b$ through a contact plug $51p$. Meanwhile, a word line $51w$ is formed on the device isolation region 50. Also, an insulation film 54 formed of, for example, silicon nitride, is formed on the gate electrode $51e$ and the word line $51w$, and an insulation film 53 is formed to cover the insulation film 54, the gate electrode $51e$, and the word line $51w$. The interlayer insulation film 1 described above is formed on the insulation film 53.

The capacitor C includes a lower electrode 7L having a pillar shape, a dielectric layer 7K covering the lower electrode 7L, and an upper electrode 7U formed on the dielectric layer 7K. The lower electrode 7L is electrically connected to the impurity diffusion region $51n$ of the transistor Tr through a contact plug 2 serving also as a source or drain electrode.

Also, in the present embodiment, the lower electrode 7L is formed of ruthenium (Ru), and for example, has a diameter of about 40 nm and a height of about 2000 nm. When an aspect ratio (height/diameter) of the lower electrode 7L is high, the lower electrode 7L may be destroyed, and thus a support film 5 for preventing destruction of the lower electrode 7L is formed at upper portion of the lower electrode 7L. As will be described below, the support film 5 is formed by boron-containing silicon nitride (SiBN). For convenience of description, the support film 5 may also be referred to as a SiBN film.

Also, the dielectric layer 7K is formed of a high dielectric (high-k) material, such as hafnium oxide ($HfO_2$), aluminum oxide ($Al_2O_3$), strontium titanate ($SrTiO_3$), or zirconium oxide ($ZrO_2$). Alternatively, the dielectric layer 7K may be formed of a multilayer where the above materials are stacked Also, the upper electrode 7U may be formed by using a metal such as Ru or tungsten (W), or polysilicon.

(Embodiment 2)

Next, a manufacturing method of a semiconductor device, according to an embodiment 2 of the present invention will now be described. Hereinafter, the semiconductor device 100 of FIG. 1 is manufactured.

(Manufacture of Transistor Tr)

The manufacturing of the transistor Tr of the semiconductor device 100 will now be described. First, the device isolation region 50 is formed by forming the recess portion for the device isolation region 50 in the wafer W via a photolithography technology, depositing, for example, silicon oxide, on the wafer W so as to embed the recess portion, and then removing a silicon oxide film thereof via, for example, a chemical mechanical polishing (CMP) method. Next, an n-type impurity, such as phosphorous, is ion-injected to a region between the device isolation regions 50 with respect to a surface of the wafer W. Then, a mask layer is formed on the region injected with ions and the recess portion is formed on the wafer W via the mask layer. Accordingly, the region injected with ions is divided, and thus the impurity diffusion regions $51c$ and $51n$ are obtained. Also, while maintaining the mask layer, the gate oxide film $51s$ is formed on an inner surface of the recess portion via a thermal oxidation method. Next, a metal, for example, titanium oxide (TiN), and silicon nitride are deposited in the stated order so as to embed the recess portion defined by the gate oxide film $51s$ to obtain the gate electrode $51e$ and the insulation film 54, and then the mask layer is removed (lift off).

Also an opening corresponding to a surface of the device isolation region 50 is formed on the mask layer, and accordingly, the word line $51w$ is formed together with the gate electrode $51e$, and the insulation film 54 is also formed on the word line $51w$.

Then, the insulation film 53 is formed to cover surfaces of the gate electrode $51e$, the insulation film 54, and the wafer W. Next, the contact plug $51p$ contacting the impurity diffusion region $51c$ is formed in the insulation film 53, and then the bit line $51b$ contacting the contact plug $51p$ is formed. Then, the interlayer insulation film 1 is formed to cover the insulation film 53 and the bit line $51b$, and then, in order to form the contact plug 2 via a photolithography technology and etching, an opening penetrating through the interlayer insulation film 1 and the insulation film 53 is formed.

Next, Ti and TiN are deposited in the stated order on a side surface and bottom surface of the opening, and on the interlayer insulation film 1, and W is deposited to embed the opening. Then, Ti, TiN, and W deposited on the interlayer insulation film 1 are removed via a CMP method, and the interlayer insulation film 1 is exposed. Accordingly, the contact plug 2 penetrating through the interlayer insulation film 1 and the insulation film 53, and electrically connected to the impurity diffusion region $51n$ is formed. Then, the manufacturing of the transistor Tr is completed by forming an insulation film (silicon nitride) 3 on the interlayer insulation film 1.

(Manufacture of Capacitor C)

Next, the manufacturing the capacitor C of the memory cell 100 will be described with reference to FIGS. 2A through 11. For convenience of description, the transistor Tr is not shown in FIGS. 2A through 11. Also, FIGS. 2A through 8B are cross-sectional views. FIGS. 2A, 3A, 4A, 5A, 6A, 7A, and 8A are cross section views corresponding to a cross section (x-z surface) of FIG. 1, and FIGS. 2B, 3B, 4B, 5B, 6B, 7B, and 8B are cross-section views (z-y surface) taken along a line A-A respectively of FIGS. 2A, 3A, 4A, 5A, 6A, 7A, and 8A.

Figure 2A:
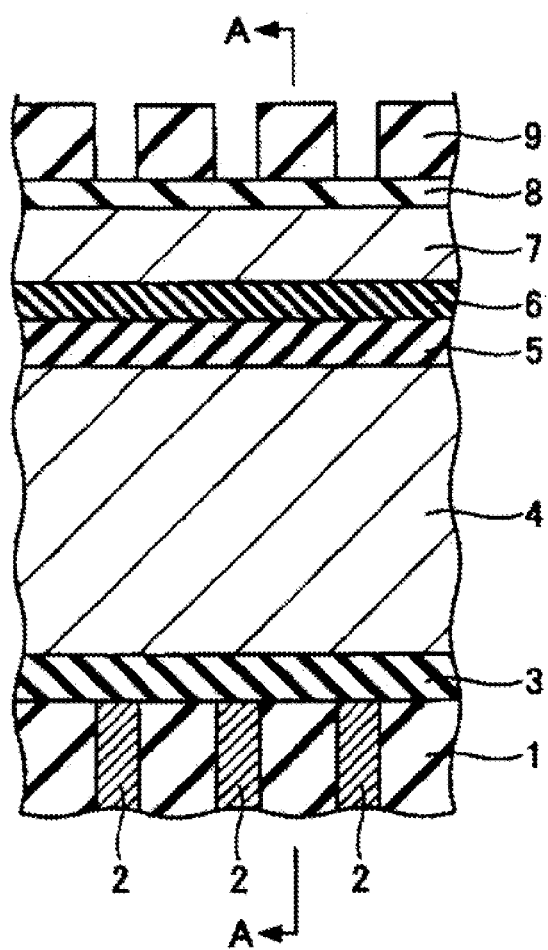
FIGS. 2A and 2B are views for explaining a manufacturing method of a semiconductor device, according to an embodiment of the present invention.
Figure 2B:
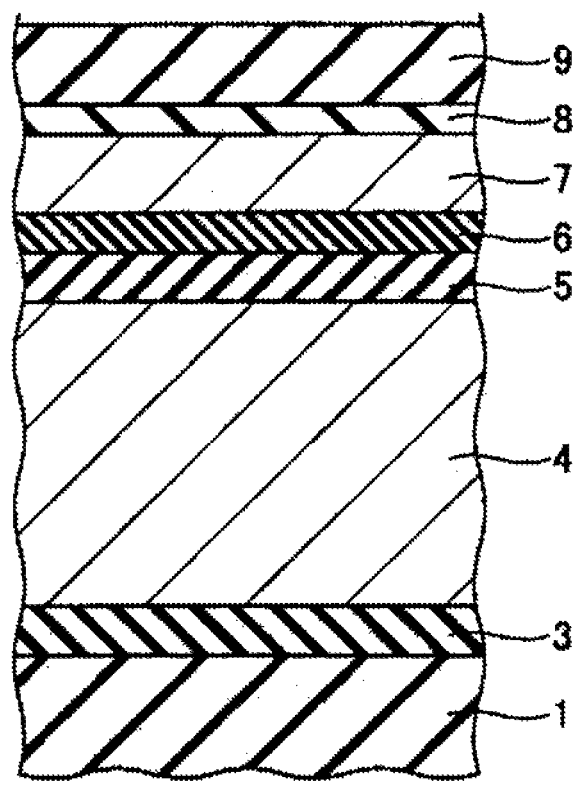

As shown in FIGS. 2A and 2B, a silicon oxide film 4, the boron-containing silicon nitride (SiBN) film 5, a silicon oxide film 6, an amorphous carbon film 7, and an antireflection film 8 are deposited in the stated order on the insulation film 3, via, for example, a CVD method. Film thicknesses thereof are, for example, about 50 to 100 nm for the insulation film 3, about 1 to 3 μm for the silicon oxide film 4, about 100 nm for the SiBN film 5, about 100 nm for the silicon oxide film 6, and about 800 nm for the amorphous carbon film 7. Also, the antireflection film 8 may be formed of a silicon oxynitride (SiON) layer and a silicon oxide film deposited thereon.

Also, the SiBN film 5 is suitably formed via a deposition method according to an embodiment of the present invention described below. Such a film forming method will be described later.

Also, a photoresist film 9 is formed on the antireflection film 8, and as shown in FIG. 2A, the photoresist film 9 is patterned in a line-and-space (L/S) pattern where lines extending in a y-axis direction are arranged in predetermined pitches in an x-axis direction. Here, a space of the L/S pattern is located above the contact plug 2, and a width of the space is equal to a width (diameter) of the contact plug 2.

Figure 3A:
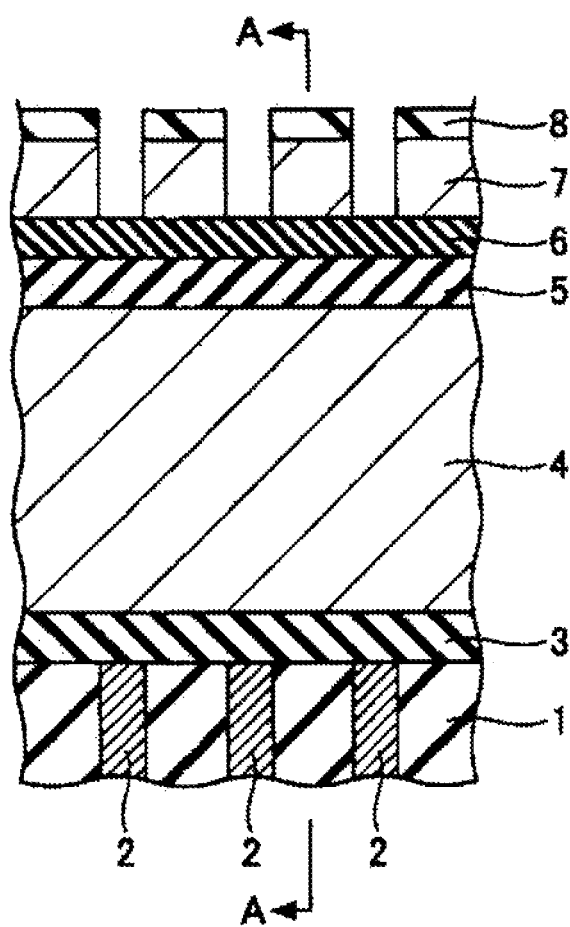
FIGS. 3A and 3B are views for explaining the manufacturing method after FIGS. 2A and 2B, according to an embodiment of the present invention.
Figure 3B:
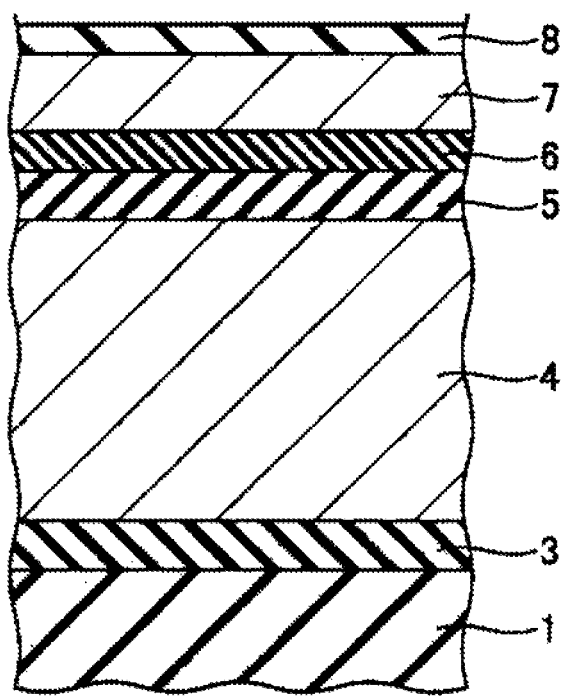
Figure 4B:
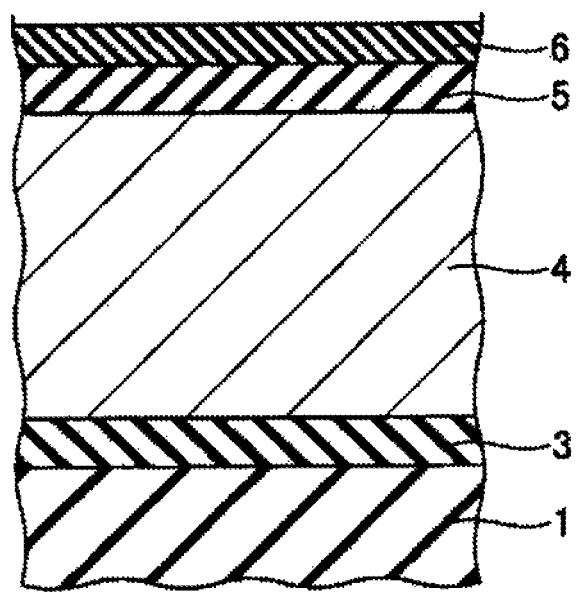
Figure 5B:
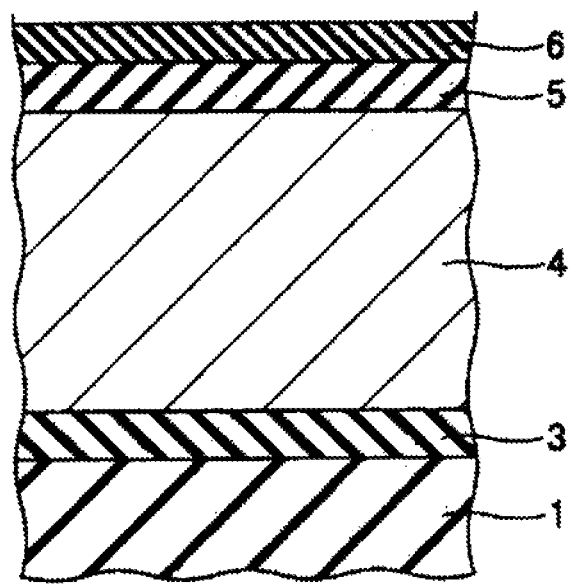

Next, the antireflection film 8 is etched via anisotropic dry etching using a $CF_4$ gas and by using the photoresist film 9 as a mask, and the amorphous carbon film 7 is etched via anisotropic dry etching using an oxygen ($O_2$) gas and by using the photoresist film 9 and the etched antireflection film 8 as masks. Here, the photoresist film 9 is also removed via etching using the $O_2$ gas. As a result, a structure shown in FIGS. 3A and 3B is obtained.

Next, the silicon oxide film 6, the SiBN film 5, the silicon oxide film 4, and the insulation film 3 (silicon nitride) are etched via anisotropic dry etching by using the amorphous carbon film 7 to which the L/S pattern is transferred as a mask. As a result, as shown in FIG. 4A, a plurality of groove portions 10 extending in a y-axis direction by penetrating through the silicon oxide film 6, the SiBN film 5, the silicon oxide film 4, and the insulation film 3, and arranged in predetermined pitches in an x-axis direction are formed. The contact plug 2 is exposed at a bottom of the groove portion 10.

Then, a ruthenium (Ru) film 11 is deposited via a CVD method to cover a surface of the silicon oxide film 6 that has not been etched, and embed the groove portion 10. Next, the Ru film 11 is removed until the silicon oxide film 6 is exposed via dry etching using a mixed gas of an oxygen ($O_2$) gas and a chlorine ($Cl_2$) gas, or via a CMP method. As a result, as shown in FIG. 5A, the Ru film 11 embedded in the groove portion 10 is exposed on the surface of the silicon oxide film 6. Also, a bottom of the Ru film 11 is electrically connected to the contact plug 2.

Figure 6A:
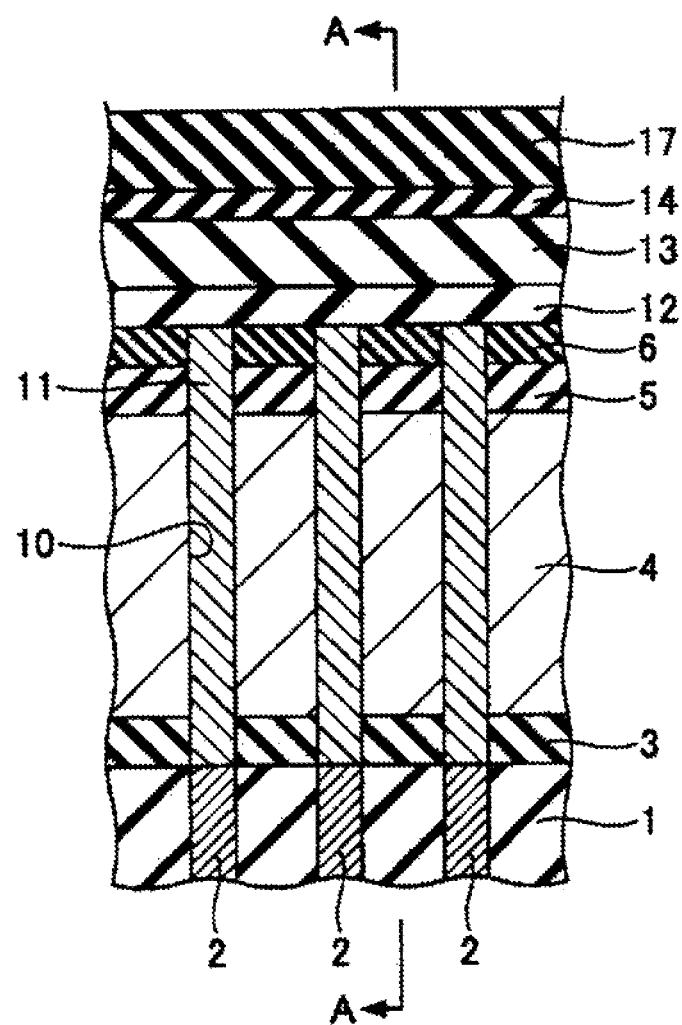
FIGS. 6A and 6B are views for explaining the manufacturing method after FIGS. 5A and 5B, according to an embodiment of the present invention.
Figure 6B:
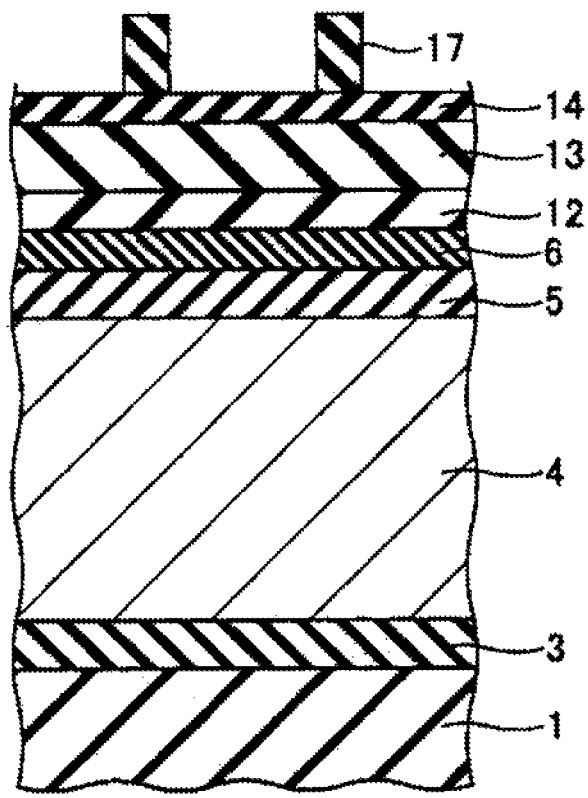

Next, a silicon oxide film 12, an amorphous carbon film 13, and an antireflection film 14 are deposited in the stated order on the surface of the silicon oxide film 6 and the Ru film 11 exposed through the surface of the silicon oxide film 6, as shown in FIGS. 6A and 6B. Here, a film thickness of the silicon oxide film 12 is from about 90 to 110 nm, and a film thickness of the amorphous carbon film 13 is about 720 to 880 nm. Also, the antireflection film 14 may be formed by a SiON layer and a silicon oxide film deposited thereon. Also, a photoresist film 17 is formed on the antireflection film 14. The photoresist film 17 is patterned to the L/S pattern where lines extending in an x-axis direction are arranged in predetermined pitches in a y-axis direction, as shown in FIG. 6B. Also, the lines of the photoresist film 17 follow an arranged direction (x-axis direction) of the contact plug 2 while being disposed above the contact plug 2.

Also, since the lines of the photoresist film 9 shown in FIGS. 2A and 2B extend in a y-axis direction, the Ru film 11 formed based on the photoresist film 9 also extends in a y-axis direction. Meanwhile, the lines of the photoresist film 17 shown in FIGS. 6A and 6B extend in the x-axis direction. In other words, when viewed from the top (in a −z-axis direction), the lines of the Ru film 11 and the lines of the photoresist film 17 are arranged in a sharp (#) shape. Also, the contact plug 2 is disposed below a region where the lines of the Ru film 11 and the lines of the photoresist film 17 cross each other.

Figure 7A:
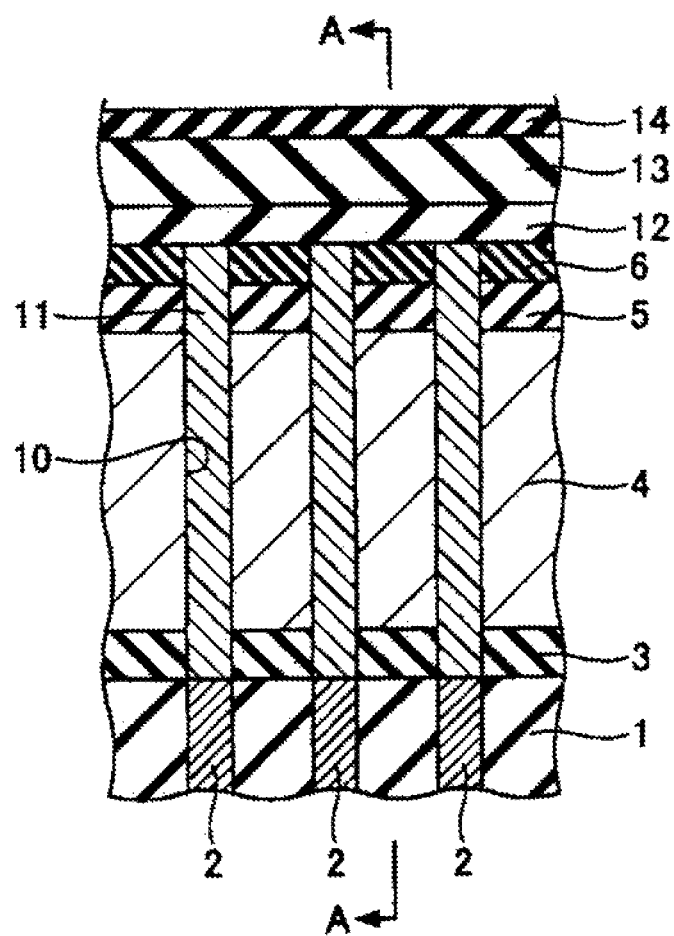
FIGS. 7A and 7B are views for explaining the manufacturing method after FIGS. 6A and 6B, according to an embodiment of the present invention.
Figure 7B:
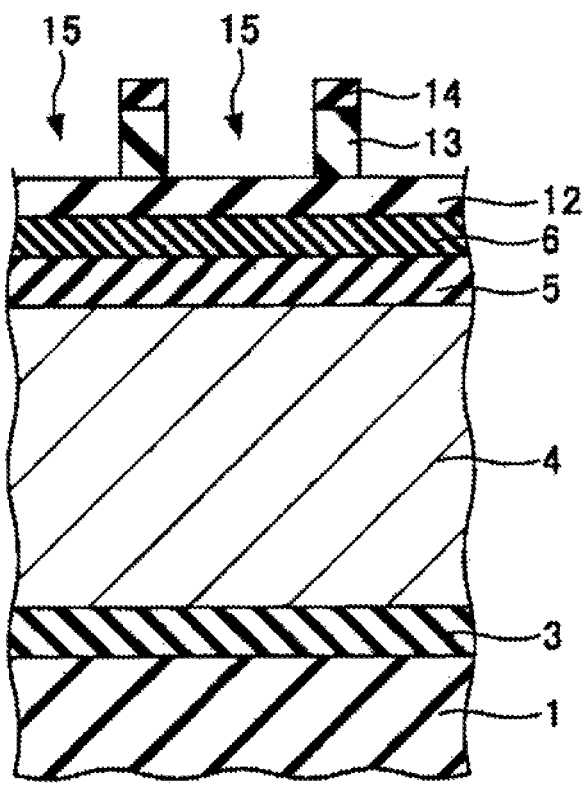

Next, the antireflection film 14 is etched via anisotropic dry etching using a $CF_4$ gas and by using the photoresist film 17 as a mask. Also, the amorphous carbon film 13 is etched via anisotropic dry etching using an $O_2$ gas and by using the photoresist film 17 and the antireflection film 14 to which the L/S pattern of the photoresist film 17 is transferred as masks. Accordingly, the L/S pattern of the photoresist film 17 is transferred to the amorphous carbon film 13. Also, the photoresist film 17 is removed via such etching. As a result, a structure shown in FIGS. 7A and 7B is obtained.

Figure 8A:
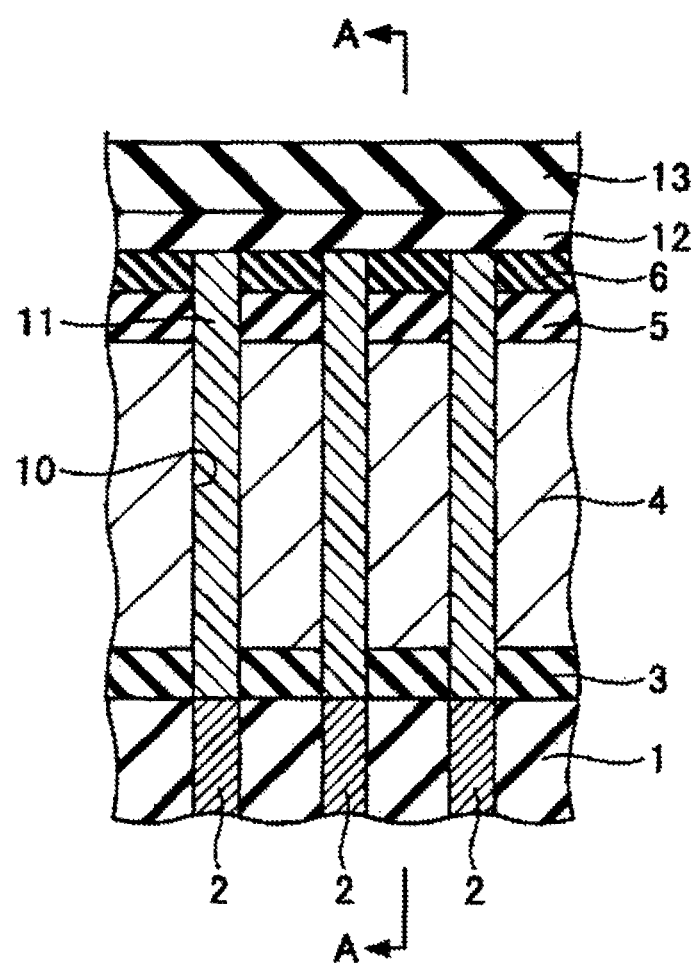
FIGS. 8A and 8B are views for explaining the manufacturing method after FIGS. 7A and 78, according to an embodiment of the present invention.
Figure 8B:
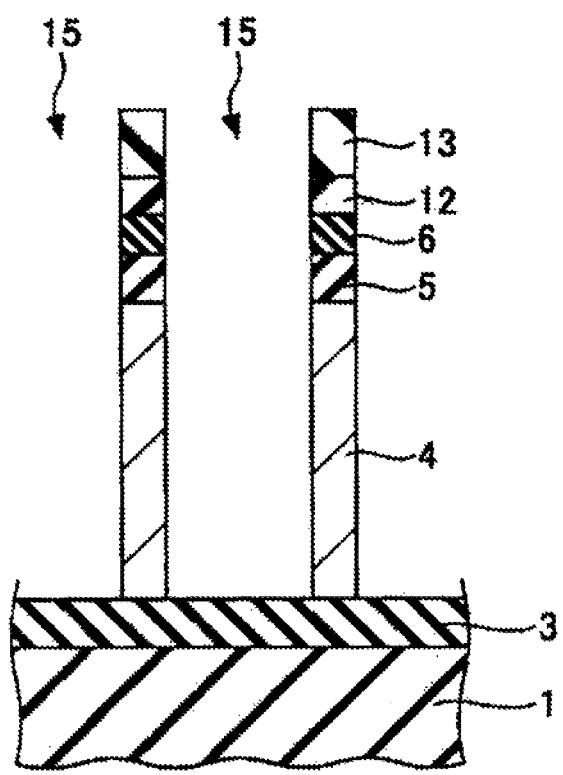
Figure 9:
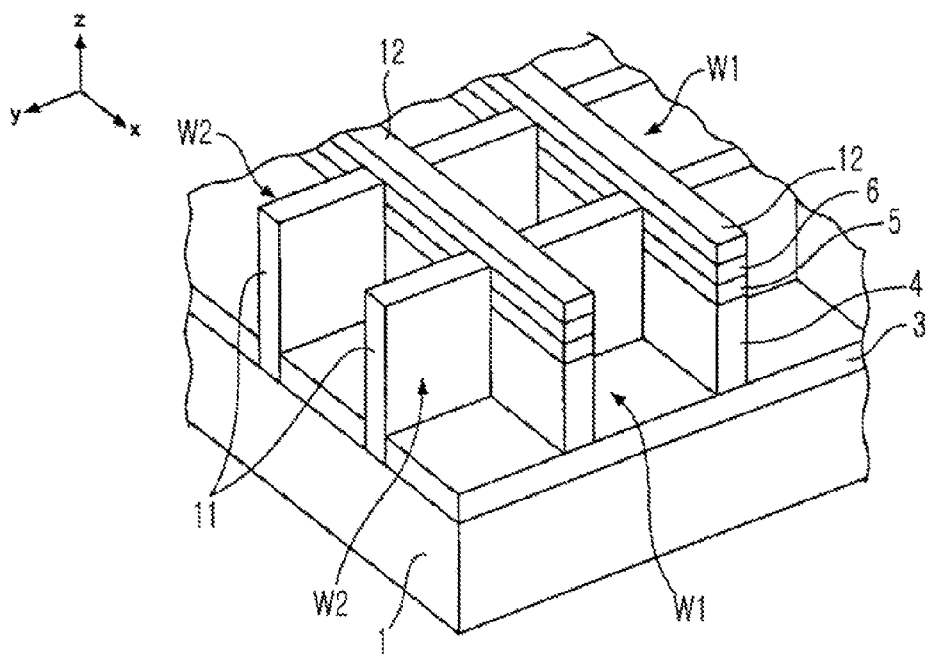
FIG. 9 is a view for explaining the manufacturing method after FIGS. 8A and 8B, according to an embodiment of the present invention.
Figure 10:
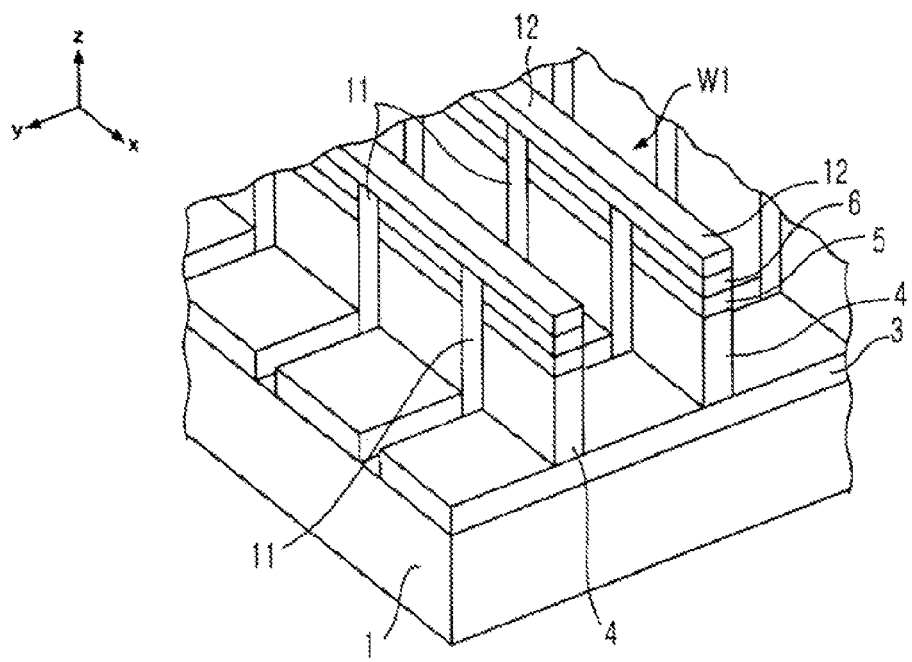
FIG. 10 is a view for explaining the manufacturing method after FIG. 9, according to an embodiment of the present invention.

Next, the silicon oxide film 12, the silicon oxide film 6, the SiBN film 5, and the silicon oxide film 4 are etched via anisotropic dry etching by using the amorphous carbon film 13 as a mask. As a result, a configuration shown in FIGS. 8A and 8B is obtained. A perspective view of the configuration is shown in FIG. 9. In other words, the configuration includes a plurality of first wall portions W1 extending in an x-axis direction and arranged in predetermined pitches in a y-axis direction, and a plurality of second wall portions W2 extending in a y-axis direction, crossing the first wall portions W1, and arranged in predetermined pitches in an x-axis direction. The second wall portion W2 includes the Ru film 11, and the first wall portion W1 includes the Ru film 11 while including the silicon oxide film 4, the SiBN film 5, the silicon oxide film 6, and the silicon oxide film 12, which remain after the etching using the amorphous carbon film 13.

Next, the Ru film 11 is anisotropic-etched by using the silicon oxide film 12 as a mask, and using, for example, an inductively coupled plasma (ICP) type dry etching apparatus. In the anisotropic etching, a mixed gas of an $O_2$ gas and a $Cl_2$ gas is used as an etching gas. Via such etching, the second wall portion W2 exposed in FIG. 9 is removed, and the first wall portion W1 is left (refer to FIG. 10).

Figure 11:
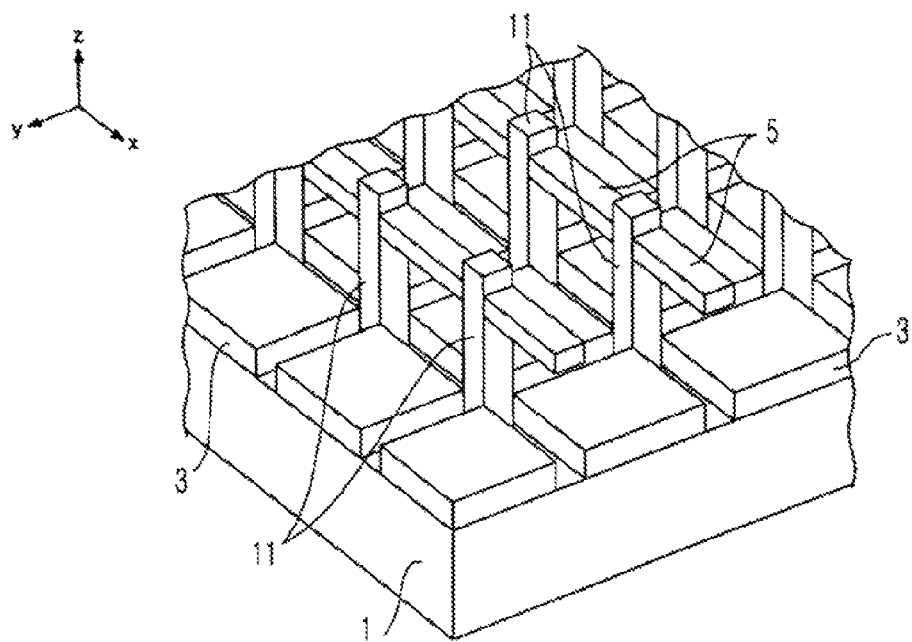
FIG. 11 is a view for explaining the manufacturing method after FIG. 10, according to an embodiment of the present invention.

Then, when the silicon oxide film 12, the silicon oxide film 6, and the silicon oxide film 4 remaining in the first wall portion W1 are removed via wet etching using diluted hydrogen fluoride (DHF), the Ru film 11 and the SiBN film 5 are left on the interlayer insulation film 1 and the insulation film 3 as shown in FIG. 11. The Ru film 11 is provided on the contact plug 2, has a plurality of pillar shapes arranged in a matrix form, and corresponds to the lower electrode 7L. As shown in FIG. 11, a upper portion of the lower electrode 7L is connected to the SiBN film 5 extending in an x-axis direction, and thus the lower electrode 7L is prevented from being destroyed.

Next, the dielectric layer 7K is formed to cover exposed surfaces of the lower electrode 7L, the insulation film 3, and the SiBN film 5. Then, the upper electrode 7U is formed by using a metal, such as Ru or W, or polysilicon via a CVD method. Then, when an interlayer insulation film 73, a wire 74, and a surface protection film 75 (FIG. 1) are formed on the upper electrode 7U, the memory cell 100 shown in FIG. 1 is completed.

(Embodiment 3)

A film forming apparatus according to an embodiment of the present invention, suitable for forming the SiBN film 5 described above will now be described with reference to FIGS. 12 and 13.

Figure 12:
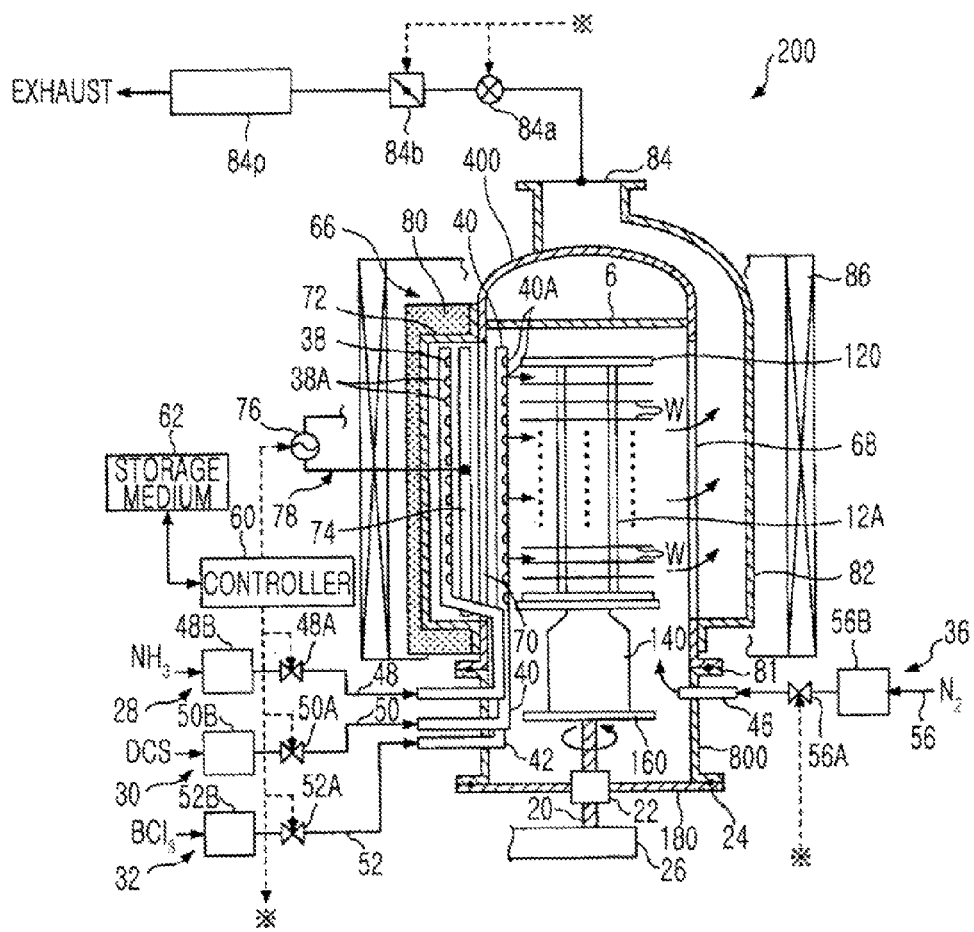
FIG. 12 is a schematic view of a film forming apparatus suitable for the manufacturing method explained with reference to FIGS. 2A through 11.
Figure 13:
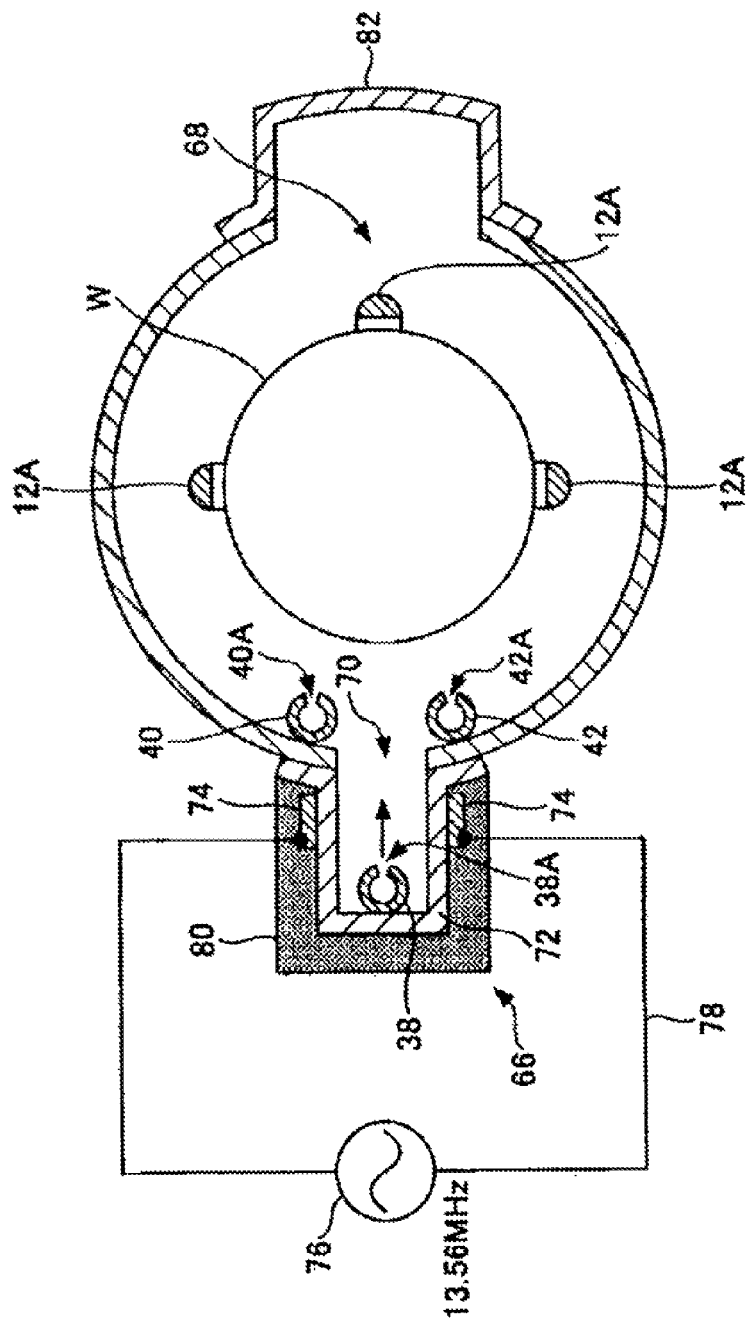
FIG. 13 is a schematic top view of the film forming apparatus of FIG. 12.

FIG. 12 is a schematic cross-sectional view showing a film forming apparatus 200 according to an embodiment of the present invention, and FIG. 13 is a cross-sectional view showing the film forming apparatus 200 (a heating unit omitted). As shown in FIG. 12, the film forming apparatus 200 includes a processing container 400 having a cylindrical shape that has an opened bottom and a ceiling. The processing container 400 is formed of, for example, quartz, and includes a ceiling plate 6 formed of quartz and formed on the ceiling thereof. Also, a manifold 800, for example, having a cylindrical shape and formed of stainless steel is connected to the opened bottom of the processing container 400 through a seal member 81, such as a O-ring, and the processing container 400 is supported by the manifold 800. A wafer boat 120 formed of quartz is elevatably provided as a holding unit where wafers W as a plurality of objects are stacked in multi-stages, such that the wafer W is freely inserted into and removed from a bottom opening of the manifold 800. In the present embodiment, supports 12A of the wafer boat 120 may hold, for example, 50 to 100 wafers W having a diameter of 300 mm at regular pitches in multi-stages.

The wafer boat 120 is placed on a table 160 via a thermo-container 140 formed of quartz, and the table 160 is supported by a rotational shaft 20 penetrating through a cover unit 180 which is formed of, for example, a stainless steel material and opens/closes the bottom opening of the manifold 800. A magnetic fluid seal 22, for example, is interposed between the rotational shaft 20 and a through hole of the cover unit 180 through which the rotational shaft 20 penetrates, and hermetically and rotatably supports the rotational shaft 20. Also, a seal member 24 formed of, for example, an O-ring, is disposed around the cover unit 180 and at a bottom of the manifold 800, thereby holding sealability inside the processing container 400.

The rotational shaft 20 is adhered to, for example, a leading end of an arm 26 supported by an elevating mechanism (not shown), such as a boat elevator, and the wafer boat 120 and the cover unit 180 are integrally elevated to be transferred into and out of the processing container 400. Alternatively, the table 160 may be fixed to the cover unit 180, and the wafer W may be processed without having to rotate the wafer boat 120.

The manifold 808 is connected to a nitration gas supply unit 28 for supplying, for example, an ammonia ($NH_3$) gas as a nitration gas that is turned into plasma, a silane-based gas supply unit 30 for supplying a silane-based gas as a film forming gas, for example, a dichlorosilane (DCS) gas, a boron-containing gas supply unit 32 for supplying, for example, a $BCl_3$ gas as a boron-containing gas, and a purge gas supply unit 36 for supplying an inert gas as a purge gas, for example, a $N_2$ gas.

In detail, the nitration gas supply unit 28 includes a gas diffusion nozzle 38 is formed of a quartz pipe that penetrates through a side wall of the manifold 800 inward, and bends and extends upward. A plurality of gas ejection holes 38A are formed at predetermined intervals along a length direction of the gas diffusion nozzle 38, wherein the ammonia gas is approximately uniformly ejected toward a horizontal direction from each gas ejection hole 38A.

Also, the silane-based gas supply unit 30 has a gas diffusion nozzle 40 formed of a quartz pipe that penetrates through the side wall of the manifold 800 inward and bends and extends upward. A plurality of gas ejection holes 40A are formed at predetermined intervals along a length direction of the gas diffusion nozzle 40, wherein the DCS gas constituting a silane-based gas is approximately uniformly ejected toward a horizontal direction from each gas ejection hole 40A.

Also, the boron-containing gas supply unit 32 has a gas diffusion nozzle 42 formed of quartz pipe that penetrates through the side wall of the manifold 800 inward, and bends and extends upward. A plurality of gas ejection holes 42A (refer to FIG. 13) are formed at predetermined intervals along a length direction of the gas diffusion nozzle 42, wherein the $BCl_3$ gas is approximately uniformly ejected toward a horizontal direction from each gas ejection hole 42A.

Also, the purge gas supply unit 36 has a gas nozzle 46 penetrating through the side wall of the manifold 800 inward.

Gas passages 48, 50, 52, and 56 are respectively connected to the nozzles 38, 40, 42, and 46 described above. Switch valves 48A, 50A, 52A, and 56A, and flow rate controllers 488, 50B, 528, and 56B, such as mass flow controllers, are respectively formed in the gas passages 48, 50, 52, and 56. Accordingly, the $NH_3$ gas, the DCS gas, the $BCl_3$ gas, and the $N_2$ gas may be supplied while flow rates thereof are controlled. Also, supply and stop of each gas, control of a flow rate, a switch valve 84a and pressure adjusting valve 84b of an exhaust system ES, on and off of a high frequency power source 76, etc. are performed by a controller 60 including, for example, a computer. The controller 60 also controls overall operations of the film forming apparatus 200. Also, the controller 60 controls the film forming apparatus 200 and each element or member by reading a program from a storage medium 62 storing programs for performing control, and executing the read program. Examples of the storage medium 62 include a hard disk, a compact disk, an optical magnetic disk, a memory card, and a floppy disk (registered mark), An activation unit 66 that activates a nitrogen gas by generating plasma along a height direction of the activation unit 66 is formed at a part of the side wall of the processing container 400. In detail, the activation unit 66 is formed by hermetically covering an opening 70 formed thin and long in an up-and-down direction of the side wall of the processing container 400, from outside the opening 70, by using, for example, a plasma partition wall 72 formed of quartz. In more detail, the activation unit 66 is formed by welding the plasma partition wall 72 to the opening 70 from outside the opening 70. Accordingly, a space outwardly sunken in a concave shape to be opened toward the processing container 400 is formed on the side wall of the processing container 400. The opening 70 is sufficiently formed long in the up-and-down direction so as to cover all of the wafers W held by the wafer boat 120 in a height direction.

Also, a long and thin pair of plasma electrodes 74 extending in the up-and-down direction and facing each other are formed along two side walls outside the plasma partition wall 72 (refer to FIG. 13). The high frequency power source 76 for plasma generation is connected to the plasma electrode 74 through a power feeding line 78, and plasma may be generated in an inner space of the plasma partition wall 72 by applying a high frequency voltage of, for example, 13.56 MHz, to the plasma electrode 74. Here, a frequency of the high frequency voltage is not limited to 13.56 MHz, and another frequency, for example, 400 kHz, may be used.

Also an insulation protection cover 80 formed of, for example, quartz, is adhered outside the plasma partition wall 72 to cover the plasma partition wall 72. Also, a coolant passage (not shown) is formed inside the insulation protection cover 80, and the plasma electrode 74 may be cooled down by flowing a cooled nitrogen gas or cooling water therethrough.

Also, the gas diffusion nozzle 38 for a nitration gas penetrates through the side wall of the manifold 800 inward, bends and extends upward, bends outward of a radius direction of the processing container 400, and stands along a surface facing the wafer boat 120 of the plasma partition wall 72. Accordingly, when a high frequency voltage is applied from the high frequency power source 76 to the plasma electrode 74, the ammonia gas ejected from the gas ejection hole 38A of the gas diffusion nozzle 38 is activated in the inner space of the plasma partition wall 72, and flows towards the wafer boat 120 inside the processing container 400.

Meanwhile, as shown in FIG. 13, the gas diffusion nozzle 40 for a silane-based gas and the gas diffusion nozzle 42 for a boron-containing gas each stands outside the opening 70 of the plasma partition wall 72 with respect to the inside of the processing container 400. The silane-based gas and the $BCl_3$ gas are respectively ejected from the gas ejection holes 40A and 42A formed on the nozzles 40 and 42 toward a center direction of the processing container 400.

Also, a thin and long exhaust hole 68 for exhausting an inside of the processing container 400 is formed to face the wafer boat 120 on the processing container 400 so as to block the activation unit 66. Also, an exhaust hole cover member 82 formed of quartz and molded to have a cross section of "]" shape is adhered via welding to cover the exhaust hole 68. The exhaust hole cover member 82 extends upward along the side wall of the processing container 400, and has a gas outlet 84 above the processing container 400. The gas outlet 84 is connected to the exhaust system ES including the switch valve 84a, the pressure adjusting valve 84b, and a vacuum pump 84p, and the processing container 400 is exhausted to a vacuum via the exhaust system ES. Also, the heating unit 86 having a container shape and for heating the processing container 400 and the wafer W therein is formed by surrounding an outer circumference of the processing container 400.

(Embodiment 4)

Figure 14:
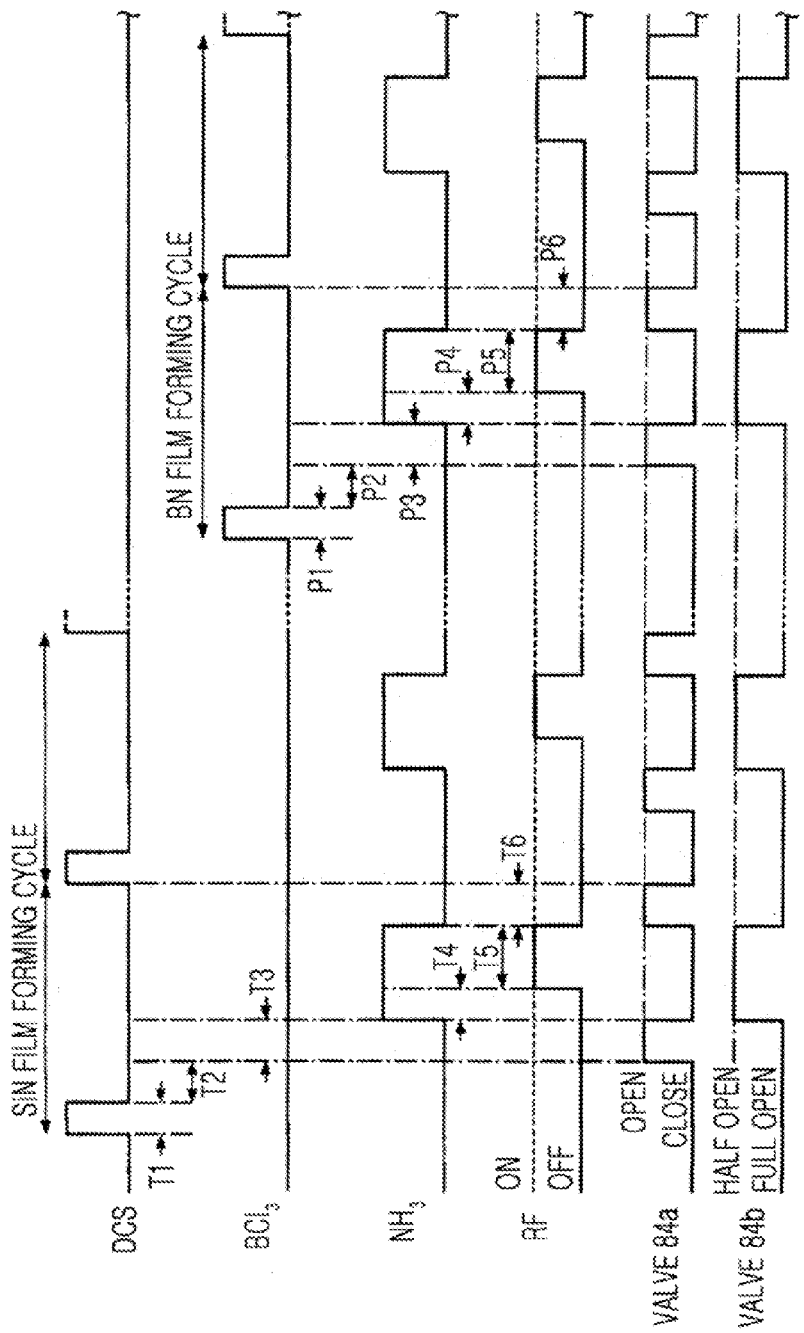
FIG. 14 is a timing chart for explaining a film forming method, according to an embodiment of the present invention.

Then, forming of the SiBN film described above by using the film forming apparatus 200 with respect to a film forming method according to an embodiment 4 of the present invention will now be described with reference to FIGS. 12, 13, and 14.

First, for example, 50 to 100 wafers W having a size of 300 mm are loaded on the wafer boat 120 (FIG. 12). Then, the wafer boat 120 is inserted from the bottom of the processing container 400 into the processing container 400 set to a predetermined temperature, and the cover unit 180 is closed to seal the processing container 400. The processing container 400 is exhausted to maintain a predetermined pressure while supply power to the heating unit 86 is increased, thereby heating the wafer W to maintain a process temperature.

Next, the switch valve 84a (FIG. 12) of the exhaust system ES is opened, the pressure adjusting valve 84b is fully opened, and the inside of the processing container 400 is exhausted to a desired vacuum level by using the vacuum pump 84p. Then, the inside of the processing container 400 is sealed by closing the switch valve 84a. Next, the switch valve 50A (FIG. 12) is opened, the DCS gas is supplied into the processing container 400 from the silane-based gas supply unit 30, and the switch valve 50A is closed after a predetermined time period T1 (FIG. 14). Then, the processing container 400 is maintained while sealed for a predetermined time period T2. The DCS gas supplied into the processing container 400 during the time period T1 is captured in the processing container 400 not only during the time period T1 but also during the time period T2, and thus the DCS gas is sufficiently adsorbed to a surface of the wafer W held by the wafer boat 120.

Next, the switch valve 84a is opened while the pressure adjusting valve 84b is fully opened, and the DCS gas in the atmosphere inside the processing container 400 is exhausted. After a predetermined time period T3 has passed, the switch valve 48A (FIG. 12) is opened, and the NH₃ gas is supplied from the nitration gas supply unit 28 into the processing container 400 while, for example, half-opening the pressure adjusting unit 84b, thereby maintaining the inside of the processing container 400 to a predetermined pressure. After the pressure inside the processing container 400 is stabilized after a predetermined time period T4 has passed, when the high frequency power source 76 is turned on to apply a high frequency voltage of, for example, 13.56 MHz, to the plasma electrode 74, plasma is generated in the inner space of the plasma partition wall 72, and thus the NH₃ gas is activated. Active species generated via activation of NH₃ nitrify the DCS gas adsorbed to the surface of the wafer W and one or several molecular SiN layers are formed on the surface of the wafer W. After a predetermined time period T5 has passed, the high frequency power source 76 is turned off and the switch valve 48A is closed while fully opening the pressure adjusting valve 84b, thereby exhausting the NH₃ gas inside the processing container 400 for a predetermined time period T6, and then the pressure adjusting valve 84b is re-closed Next, cycles from the time periods T1 through T6 are repeated a predetermined number is of times, and a SiN film having a predetermined number of molecules is formed on the surface of the wafer W.

Then, after a final time period T6 of film forming cycles of the SiN film, the switch valve 52A of the boron-containing gas supply unit 32 is opened, instead of the switch valve 50A of the silane-based gas supply unit 30, to supply the BCl₃ gas into the processing container 400 while the pressure adjusting valve 84b is closed, and after a predetermined time period P1 has passed, the switch valve 52A is closed. Then, the processing container 400 is maintained in a sealed state for a predetermined time period P2. The BCl₃ gas supplied during the time period P1 into the processing container 400 is captured in the processing container 400 not only during the time period P1 but also during the time period P2, and thus the BCl₃ gas is sufficiently adsorbed on the surface (SiN film) of the wafer W held by the wafer boat 120.

Then, the switch valve 84a is opened while the pressure adjusting valve 84b is fully opened, and the BCl₃ gas in the atmosphere of the processing container 400 is exhausted. After a predetermined time period P3 has passed, the switch valve 48A (FIG. 12) is opened, and the NH₃ gas is supplied from the nitration gas supply unit 28 into the processing container 400 while half-opening the pressure adjusting valve 84b, thereby maintaining the inside of the processing container 400 to a predetermined pressure. After the pressure inside the processing container 400 is stabilized after a predetermined time period P4, when the high frequency power source 76 is turned on to apply a high frequency voltage of, for example, 13.56 MHz, to the plasma electrode 74, plasma is generated in the inner space of the plasma partition wall 72, and thus the NH₃ gas is activated. Active species generated by activating NH₃ nitrify the BCl₃ gas adsorbed to the surface of the wafer W, and one or several molecular BN layers are formed on the surface of the wafer W. After a predetermined time period P5 has passed, the high frequency power source 76 is turned off and the switch valve 48A is closed while fully opening the pressure adjusting valve 84b, thereby exhausting the BCl₃ gas inside the processing container 400 for a predetermined time period P6. Next, a cycle from the time period P1 to the time period P6 is repeated a predetermined number of times, and the BN film having a predetermined number of molecules is formed on the surface of the wafer W.

Then, the SiN film forming cycle from the time period T1 to the time period T6, and the BN film forming cycle from the time period P1 to the time period P6 are repeated a predetermined number of times, and thus a SiBN film is formed. Also, by changing the number of SN film forming cycles and the number of BN film forming cycles, compositions x and y of $Si_xB_yN_z$ (x+y+z=1) may be adjusted.

Examples of conditions of the film forming method are as follows.

DCS Flow Rate: 50 to 2000 sccm
BCl₃ Flow Rate: 50 to 300 sccm
NH₃ Flow Rate: 500 to 5000 sccm
Pressure in Processing Container 400 while Supplying NH₃: 13.3 to 133 Pa
Period T1: about 3 seconds
Period T2: 0 to 30 seconds
Period T3: 5 to 10 seconds
Period T4: about 1 second
Period T5: 20 seconds
Period T6: 5 to 10 seconds
Period P1: 5 to 15 seconds
Period P2: 5 to 10 seconds
Period P3: 5 to 10 seconds
Period P4: about 1 second Period P5: 20 seconds Period P6: 5 to 10 seconds Also, during the time periods T3, T6, P3, and P6 of exhausting the inside of the processing container 400, for example, an inert gas may be supplied from the purge gas supply unit 36 into the processing container 400, and a gas remaining in the processing container 400 may be purged. Also, the high frequency power source 76 may be turned on when supplying of the $NH_3$ gas is started, without the time periods T4 and P4 of stabilizing the flow rate of the $NH_3$ gas and the pressure inside the processing container 400.

Effects and advantages of the film forming method according to the present embodiment 4 will now be described with reference to FIGS. 15 through 18.

Figure 15:
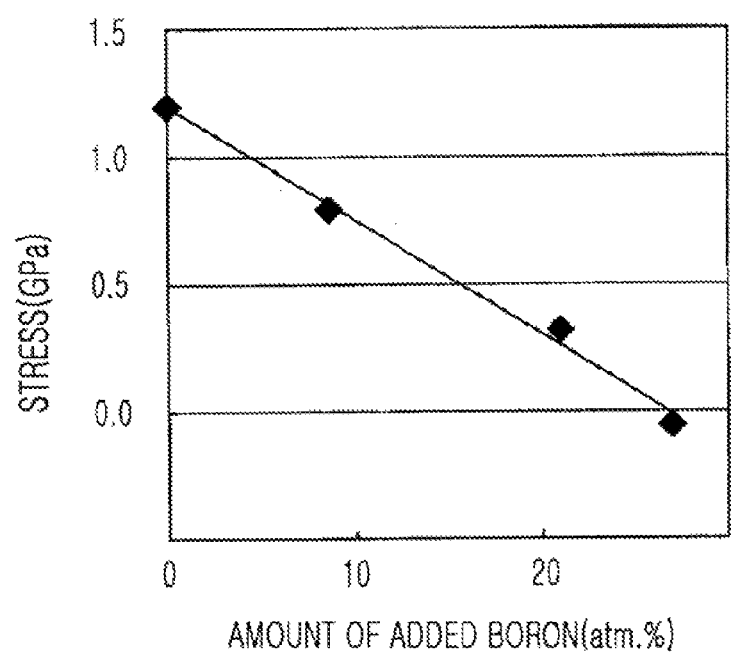
FIG. 15 is a graph for explaining results of experiments performed to check effects of a film forming method, according to an embodiment of the present invention.

FIG. 15 is a graph showing a relationship between a stress applied to a SiBN film (including SiN film) and a boron concentration in the SiBN film. The boron concentration (atm. %) in FIG. 15 corresponds to a composition y in $Si_xB_yN_z$ (x+y+z=1) Here, a composition z is almost 0.6 and (x+y) is almost 0.4. Also, the stress in the SiBN film was obtained based on results of measuring bending of a wafer by a stress meter before and after forming a SiBN film on the wafer. Here, a film forming temperature of the SiBN film was 550° C.

Figure 16:
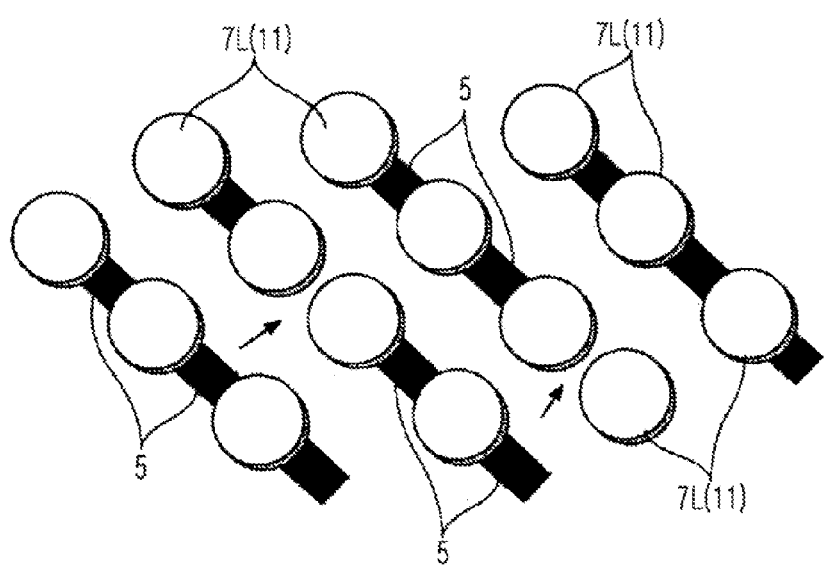
FIG. 16 is a view for explaining effects obtained by a semiconductor device and a manufacturing method of the same, according to an embodiment of the present invention.

As shown in FIG. 15, when the boron concentration is 0 (i.e., SiN film), a tensile stress in a film is almost about 1.2 GPa. However, the stress rapidly decreases as the composition y increases. Specifically when the composition y is 0.3, the stress applied to the SiBN film becomes compression stress (about 0.1 GPa). For example, when tensile stress is applied to the SiBN film as the support film 5 of FIG. 11, the lower electrodes 7L (Ru films 11) may be stressed and tilted by the support films 5 and tops of the lower electrodes 7L may be drawn near to each other as shown in FIG. 16 (refer to arrows in FIG. 16) showing a top view of the support films 5 and the lower electrodes 7L. In this case, when neighboring lower electrode 7L contact each other at the tops, the capacitor C cannot be formed. However, according to the semiconductor device 100 of an embodiment of the present invention, for example, since a support film is formed by SiBN having a tensile stress lower than that of a SiN film, the lower electrode 7L may be prevented from being tilted. Based on the results of FIG. 15, the boron concentration may be in the range from 15 atm. % to 30 atm. % where a stress in a film is less than or equal to 0.5 Gpa, and more preferably in the range from 21 atm. % to 28 atm. %.

Figure 17:
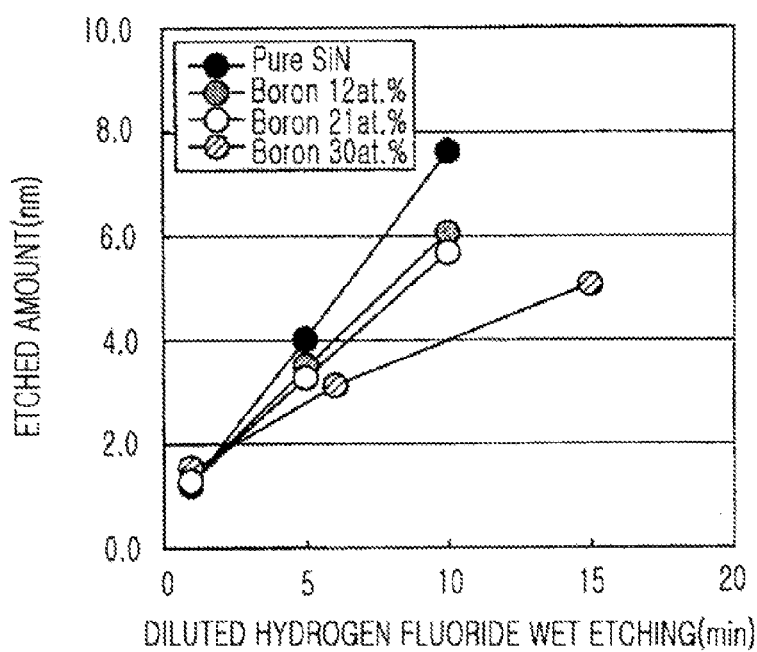
FIG. 17 is a graph for explaining results of other experiments performed to check effects of a film forming method, according to an embodiment of the present invention.

FIG. 17 shows results of investigating an etching speed of a SiBN film by DHF. In order to remove the silicon oxide film 12, the silicon oxide film 6, and the silicon oxide film 4 shown in FIG. 10 by using DHF, and obtain the support film 5 supporting the top of the lower electrode 7L it is important to investigate etching tolerance of the support film 5 by DHF.

In FIG. 17, a vertical axis denotes an etched amount and a horizontal axis denotes an etching time. Also, FIG. 17 shows results when the boron concentration is 0 atm. %, 12 atm. %, 21 atm. %, and 30 atm. %. As shown in FIG. 17, when the boron is concentration is 0 atm. % (i.e, SiN film), the etching speed by DHF is highest (slope in the graph of FIG. 17), and as the boron concentration is increased, the etching speed is decreased. Specifically when the boron concentration is 30 atm. %, an uppermost surface is etched more easily than the SiN film during initial etching, but the etching speed is half the etching speed of the SiN film As a result, it may be determined that the SiBN film has higher tolerance to DHF than the SiN film. When the tolerance to DHF is high, the support film 5 may be thin Accordingly, power applied to the lower electrode 7L is reduced, and destruction of the lower electrode 7L is further avoided. Based on the results shown in FIG. 17, the boron concentration may be in the range from 12 atm. % to 30 atm. %.

Figure 18:
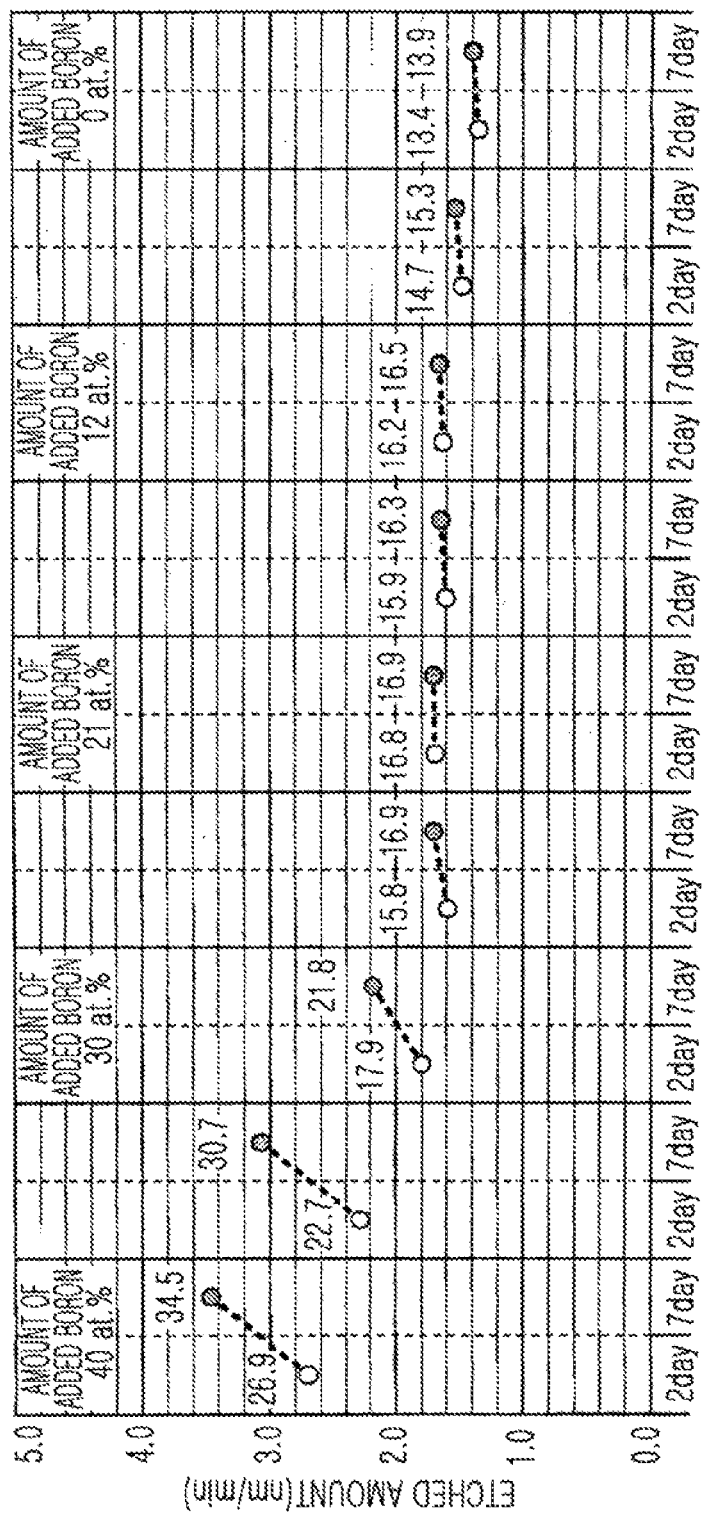
FIG. 18 is a graph for explaining results of other experiments performed to check effects of a film forming method, according to an embodiment of the present invention.

Also, FIG. 18 shows results of investigating changes of an etched amount of a SiBN film with the passage of time. In other words, the SiBN film (including SiN film) having a predetermined boron concentration is etched by DHF under the same conditions two and seven days after forming the SiBN film, and the etched amounts thereof were compared. Also, the etching two and seven days after film formation was performed on different portions of the same SiBN film formed on one wafer. As shown in FIG. 18, as the boron concentration increased, the etched amount after seven days is higher than the etched amount after two days. A reason for the increased etched amount may be because the SiBN absorbs moisture in the atmosphere, and as the boron concentration increases, a hygroscopic property may be increased. It is preferable that the changes of the etched amount with the passage of time are low in terms of reproducibility of a thickness of the support film (SiBN film) 5 left after etching the silicon oxide film 4 etc. by using DHF between the processes. Based on the results shown in FIG. 18, the boron concentration may be lower than or equal to 30 atm. % where increase of the etched amount during five days from two days to seven days after the film formation is from about 18 nm to 22 nm.

Also, when the SiBN film having the boron concentration in the above range is formed, it is easy to control compositions according to the film forming method of an embodiment of the present invention. In the film forming method, the SiN film forming cycle and the BN film forming cycle are independently performed In other words, while forming the SiN film, a boron material (for example, $BCl_3$) is not supplied to the processing container 400 (FIG. 12), and while forming the BN film, a silicon material (DCS) is not supplied to the processing container 400. For example, when the boron material and the silicon material are simultaneously supplied to the processing container 400, a ratio (adsorption ratio) of boron source molecules adsorption and silicon source molecules adsorption are controlled by a supply ratio of both sources. However, since a relationship between the adsorption ratio and the supply ratio also depends on film forming conditions, it may be difficult to sufficiently control a composition ratio via the supply ratio. According to the film forming method of an embodiment of the present invention, the adsorption ratio is not required to be controlled since only a silicon source is adsorbed to a wafer surface and is nitrated to form a SiN film, and only a boron source is adsorbed to the wafer surface and is nitrated to form a BN film. Also, since a composition ratio can be controlled via a film number ratio of the SiN film and the BN film, controllability is good.

Based on the above results, effects and advantages of the semiconductor device, the manufacturing method of a semiconductor device, the film forming apparatus, and the film forming method according to embodiments of the present invention are understood.

While this invention has been particularly shown and described with reference to exemplary embodiments thereof, it will be understood by those skilled in the art that various changes in form and details may be made therein without departing from the spirit and scope of the invention as defined by the appended claims.

For example, in the film forming apparatus 200 described above, the switch valve 84a and the pressure adjusting valve 84b are formed between the processing container 400 and the vacuum pump 84p, but alternatively, a switch valve having a pressure adjusting function (a blockable pressure adjusting valve) may be used.

Also, a gate electrode in addition to a groove type may be used as an MOS type transistor. For example, a planar type or vertical type transistor may be used.

According to the embodiments of the present invention, the film forming method capable of preventing destruction of electrodes having a pillar shape and densely arranged, the manufacturing method of a semiconductor device using the same, the film forming apparatus, and the semiconductor device are provided.

What is claimed is:

1. A boron-added silicon nitride film forming method performed by a film forming apparatus including a reaction pipe which accommodates a substrate holding unit capable of holding a substrate; a first source gas supply unit which supplies the silicon-containing gas to the reaction pipe and has a first switch valve for controlling supply and stop of the silicon-containing gas to the reaction pipe; a second source gas supply unit which supplies the boron-containing gas to the reaction pipe and has a second switch valve for controlling supply and stop of the boron-containing gas to the reaction pipe; a third source gas supply unit which supplies the nitrogen-containing gas to the reaction pipe and has a third switch valve for controlling supply and stop of the nitrogen-containing gas to the reaction pipe; and a fourth switch valve which is formed between the reaction pipe and an exhaust unit connected to the reaction pipe, and connects or disconnects between the reaction pipe and the exhaust unit, the boron-added silicon nitride film forming method comprising:

forming a silicon nitride layer by using the silicon-containing gas and the nitrogen-containing gas, and forming a boron nitride layer by using the boron-containing gas and the nitrogen-containing gas, wherein, after a first predetermined times of the forming of the silicon nitride layer are performed, a second predetermined times of the forming of the boron nitride layer are performed, and wherein the forming of the silicon nitride layer comprises:

supplying the silicon-containing gas to the reaction pipe by opening the first switch valve while the fourth switch valve is closed;

holding in the reaction pipe the silicon-containing gas supplied to the reaction pipe by closing the first switch valve;

exhausting an inside of the reaction pipe by opening the fourth switch valve; and supplying the nitrogen-containing gas by opening the third switch valve, and wherein the forming of the boron nitride layer comprises:

supplying the boron-containing gas to the reaction pipe by opening the second switch valve while the fourth switch valve is closed;

holding in the reaction pipe the boron-containing gas supplied to the reaction pipe by closing the second switch valve;

exhausting the inside of the reaction pipe by opening the fourth switch valve; and supplying the nitrogen-containing gas by opening the third switch valve.

2. The film forming method of claim 1, wherein, during the supplying of the nitrogen-containing gas, the nitrogen-containing gas is activated by plasma.

3. The film forming method of claim 1, wherein, during the supplying of the nitrogen-containing gas, a pressure inside the reaction pipe is controlled to a predetermined pressure.

4. The film forming method of claim 1, wherein a composition of silicon and a composition of boron in the boron-added silicon nitride film are adjusted by adjusting the first predetermined times and the second predetermined times.

* * * * *